United States Patent
Weber et al.

(10) Patent No.: US 11,476,809 B2
(45) Date of Patent: Oct. 18, 2022

(54) POLYPHASE DIGITAL SIGNAL PREDISTORTION IN RADIO TRANSMITTER

(71) Applicant: NOKIA SOLUTIONS AND NETWORKS OY, Espoo (FI)

(72) Inventors: Michael Weber, Neu-Ulm (DE); Bjoern Jelonnek, Ulm (DE); Jan Hellmann, Munich (DE)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 0 days.

(21) Appl. No.: 16/637,937

(22) PCT Filed: Aug. 11, 2017

(86) PCT No.: PCT/EP2017/070494
§ 371 (c)(1),
(2) Date: Feb. 10, 2020

(87) PCT Pub. No.: WO2019/029827
PCT Pub. Date: Feb. 14, 2019

(65) Prior Publication Data
US 2020/0186103 A1   Jun. 11, 2020

(51) Int. Cl.
*H03F 1/32* (2006.01)
*H03F 3/24* (2006.01)
*H04B 1/04* (2006.01)

(52) U.S. Cl.
CPC ........... *H03F 1/3258* (2013.01); *H03F 3/245* (2013.01); *H04B 1/0475* (2013.01);
(Continued)

(58) Field of Classification Search
CPC .......... H04B 1/0475; H04B 2001/0425; H04B 1/0017; H04B 1/62; H04L 27/368;
(Continued)

(56) References Cited

U.S. PATENT DOCUMENTS 9,935,810 B1 * 4/2018 Hammier .......... H04L 25/03343
2006/0133536 A1 * 6/2006 Rexberg ................ H03F 1/3258
375/297

(Continued)

FOREIGN PATENT DOCUMENTS

WO   WO 2012/154441 A1   11/2012
WO   WO 2014/092617 A1   6/2014

OTHER PUBLICATIONS

WP-01171-1.0 ,Designing Polyphase DPD Solutions with 28-nm FPGAs, White Paper, Altera Corporation, Jan. 2012 (Year: 2012).*

(Continued)

*Primary Examiner* — Aristocratis Fotakis
(74) *Attorney, Agent, or Firm* — Squire Patton Boggs (US) LLP

(57) ABSTRACT

A method comprises obtaining a transmission signal to be power-amplified in a power amplifier (361) prior to transmission; separating the transmission signal into two or more polyphase components of the transmission signal; feeding one or more polyphase components of the transmission signal comprised in the two or more polyphase components to each of two or more parallel predistortion circuits (320, 321,322); selecting a dedicated predistortion model and dedicated predistortion coefficients for each of the two or more parallel predistortion circuits (320,321,322); performing non-linear memory-based modeling on the transmission signal according to the selected dedicated predistortion models and coefficients using the one or more polyphase components; and combining output signals of the two or more parallel predistortion circuits (320,321,322) to form a predistorted transmission signal (y[n]) to be applied to the power amplifier (361).

20 Claims, 9 Drawing Sheets

(52) U.S. Cl.
CPC .............. *H03F 2200/451* (2013.01); *H03F 2201/3215* (2013.01); *H03F 2201/3233* (2013.01); *H04B 2001/0408* (2013.01)

(58) Field of Classification Search
CPC ..... H04L 25/49; H03F 1/3258; H03F 1/3247; H03F 2201/3221; H03F 2201/3227; H03F 2201/3231; H03F 2201/3233; H03F 1/3241
See application file for complete search history.

(56) References Cited

U.S. PATENT DOCUMENTS

| | | | | |
|---|---|---|---|---|
| 2006/0240786 | A1* | 10/2006 | Liu | H03F 1/3247 455/114.3 |
| 2011/0080216 | A1* | 4/2011 | Mujica | H03F 3/24 330/149 |
| 2012/0154041 | A1* | 6/2012 | Kim | H03F 1/3247 330/149 |
| 2012/0176190 | A1* | 7/2012 | Goodman | H03M 1/0626 327/551 |
| 2012/0286985 | A1* | 11/2012 | Chandrasekaran | H03F 3/24 341/144 |
| 2013/0329833 | A1* | 12/2013 | Bai | H03F 1/3247 375/297 |
| 2014/0292406 | A1* | 10/2014 | Dechen | H03F 3/195 330/149 |
| 2015/0163079 | A1* | 6/2015 | Rollins | H04L 25/08 375/296 |
| 2015/0256216 | A1* | 9/2015 | Ding | H04L 25/03012 375/297 |
| 2015/0318880 | A1* | 11/2015 | Rexberg | H03F 1/02 375/297 |
| 2017/0244582 | A1* | 8/2017 | Gal | H04L 25/03057 |
| 2018/0159483 | A1* | 6/2018 | Masood | H03F 1/0261 |
| 2018/0191383 | A1* | 7/2018 | Balakrishnan | G06F 5/01 |
| 2019/0068133 | A1* | 2/2019 | Gutman | H04L 27/368 |
| 2019/0140605 | A1* | 5/2019 | Hong | H03F 1/3247 |

OTHER PUBLICATIONS

International Search Report and Written Opinion dated Apr. 9, 2018 corresponding to International Patent Application No. PCT/EP2017/070494.

D. Domanin et al: "A Multipath Polyphase Digital-to-Analog Converter for Software Radio Transmission Systems," Circuits and Systems, 2000. Proceedings. ISCAS 2000 Geneva. IEEE, vol. 2, May 28, 2000, pp. 361-364, XP010502735.

Fredric J. Harris et al: "Digital Receivers and Transmitters using Polyphase Filter Banks for Wireless Communications," EEE Transactions on Microwave Theory and Techniques, Plenum, USA, vol. 51, No. 4, Part 02, Apr. 8, 2003, pp. 1395-1412, XP001145344.

Examination Report under sections 12 and 13 of the Patents Act, 1970 and the Patents Rules, 2003 dated Mar. 30, 2021 corresponding to Indian Patent Application No. 202047010153.

European Communication pursuant to Article 94(3) EPC, corresponding to EP Application No. 17 751 414.8, dated Nov. 16, 2021.

\* cited by examiner

US 11,476,809 B2

POLYPHASE DIGITAL SIGNAL PREDISTORTION IN RADIO TRANSMITTER

FIELD

The invention relates generally to radio transmitters and particularly to predistortion of a transmission signal before power amplification.

BACKGROUND

In radio transmitters, a transmission signal, i.e., the signal being transmitted, is amplified in a radio frequency power amplifier which amplifies the transmission signal to a level suitable for transmission over an air interface to a radio receiver. Power amplifiers are, however, not ideal components and therefore the power-amplified transmission signal is not simply a higher-amplitude copy of the signal before amplification. Instead, the power amplifier may distort the amplitude and phase of the original signal by compressing the signal or by causing nonlinearity between the input and output signals of the power amplifier which may further cause spurious out-of-band emissions. If these effects are not taken into account and corrected before transmission in the radio transmitter or in reception at the radio receiver, the decoding of the information will be hindered at the radio receiver. These effects may be especially notable if the power amplifier is required to operate with wideband signals such as signals used in wideband code-division multiple access (WCDMA) in the Universal Mobile Telecommunications System (UMTS).

The amplitude and phase distortion caused by the power amplifier may be compensated for by predistorting the transmission signal using a predistorter (predistorter circuitry) before feeding it to the power amplifier such that the total response of the predistorter—power amplifier cascade is linear.

Radio module integration and architecture simplification are key requirements for current and especially future fifth generation (5G) radio products delivering high bit rate based on multi-transmitter (multi-TX) architectures. For example, supporting 5G MIMO (Multiple-Input and Multiple-Output) with high number of TX paths requires in total a huge number of DAC (digital-to-analog conversion) interfaces with high sampling rate due to high RF bandwidth that must be supported by the RF module. This places also huge demands on the design of the predistorter and specifically on its processing sampling rate. Therefore, there is a demand for a predistorter which would provide high processing sampling rate with preferably low complexity.

BRIEF DESCRIPTION OF THE INVENTION

An object of the invention is to provide an improved solution for predistorting a transmission signal in order to overcome signal distortion caused by a power amplifier.

According to an aspect of the invention, there is provided a transmission signal predistortion method as described in claim 1.

According to another aspect of the invention, there is provided an apparatus as specified in claim 17.

According to another aspect of the invention, there is provided an apparatus as specified in claim 25.

According to another aspect of the invention, there is provided a computer program distribution medium readable by a computer and encoding a computer program of instructions for executing a computer process for transmission signal predistortion as specified in claim 26.

According to another aspect of the invention, there is provided an apparatus as specified in claim 27.

Preferred embodiments of the invention are defined in dependent claims.

LIST OF DRAWINGS

In the following, the invention will be described in greater detail with reference to the embodiments and the accompanying drawings, in which FIG. 1 illustrates the basic principle of predistortion using a feedback signal;

Figure 8:
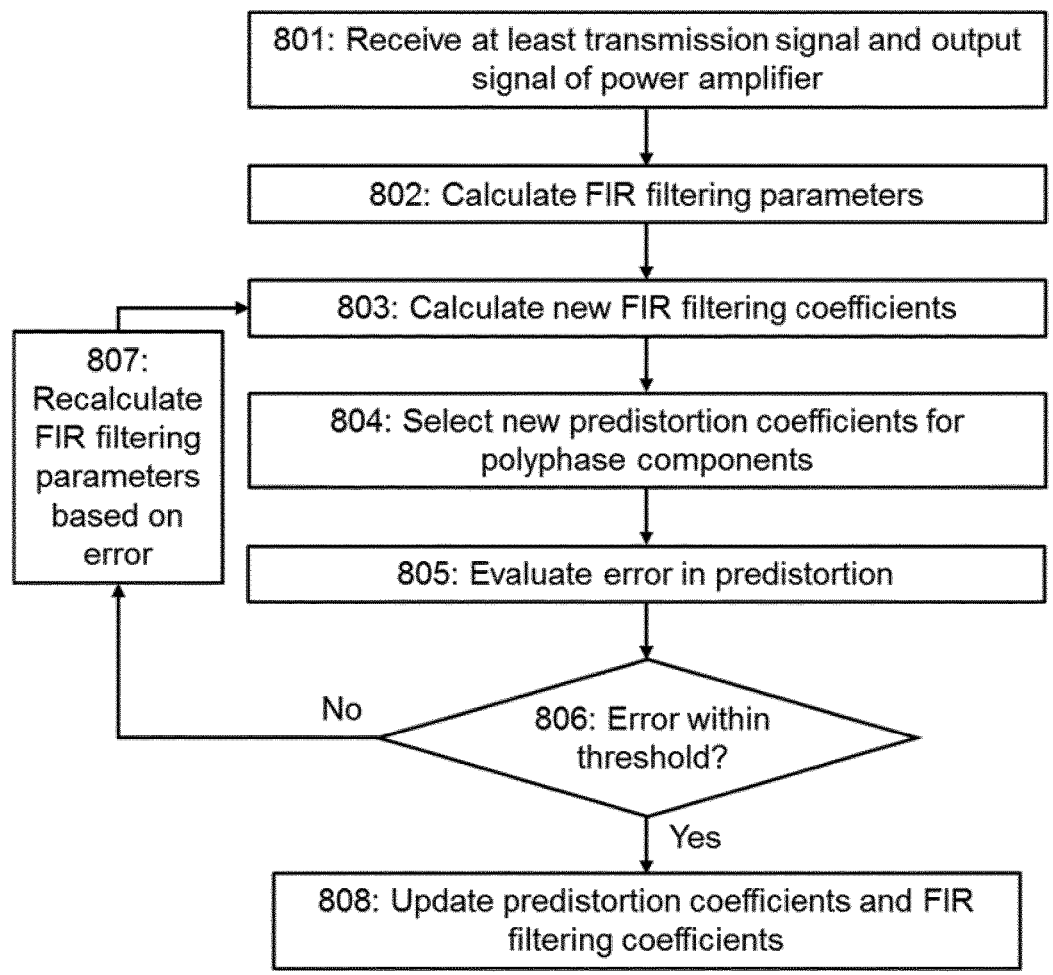
Figure 9:
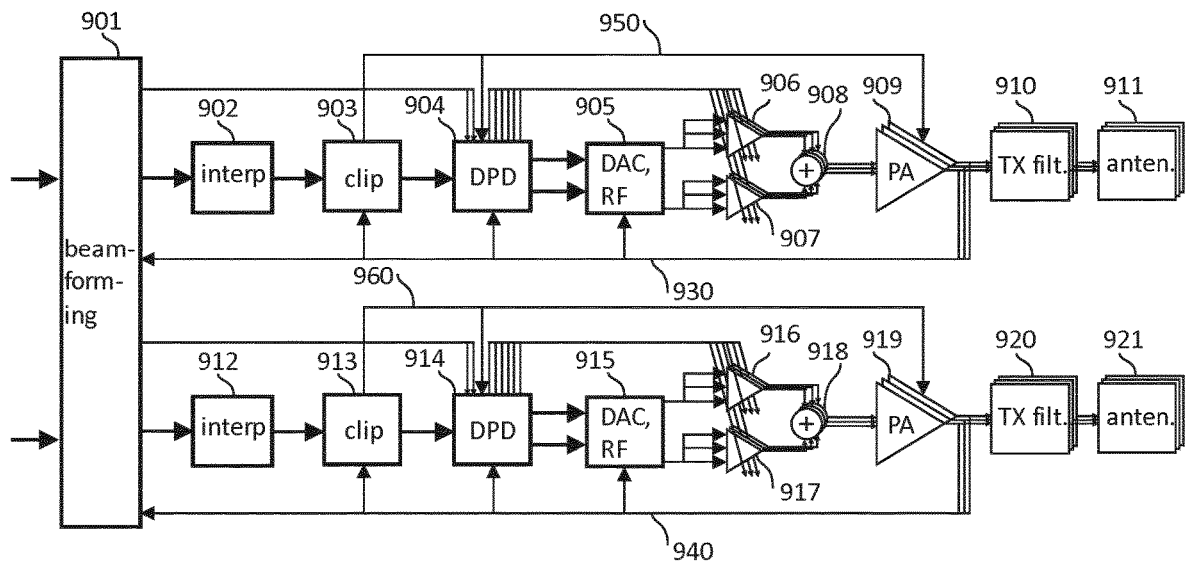
Figure 10:
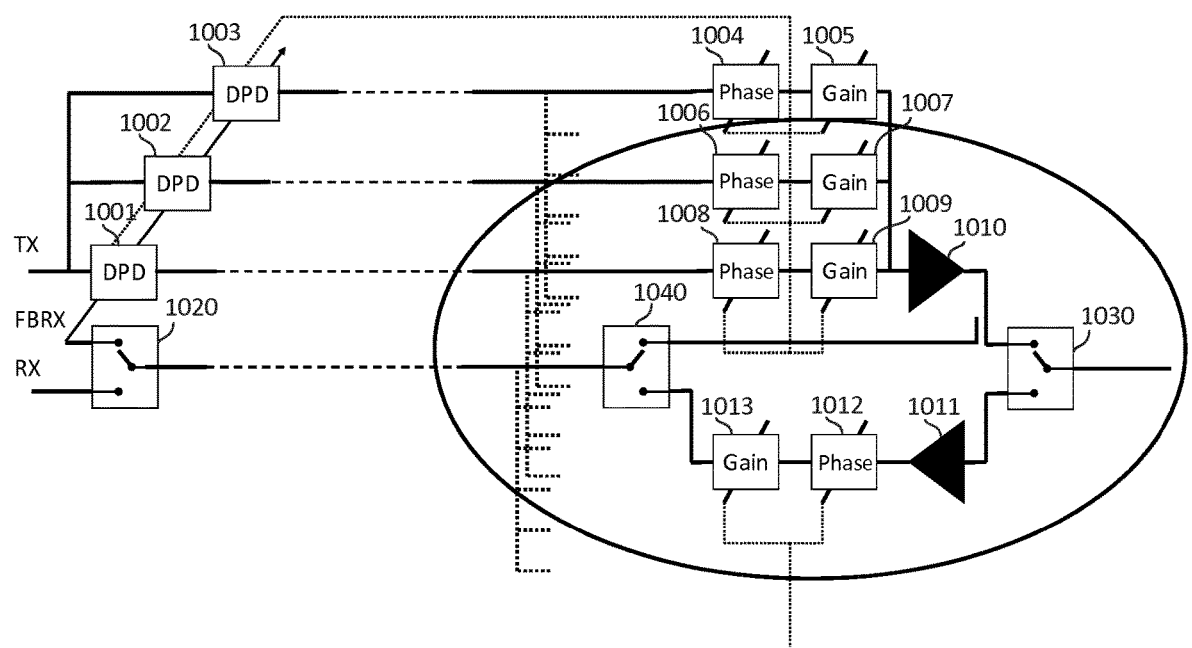
Figure 11:
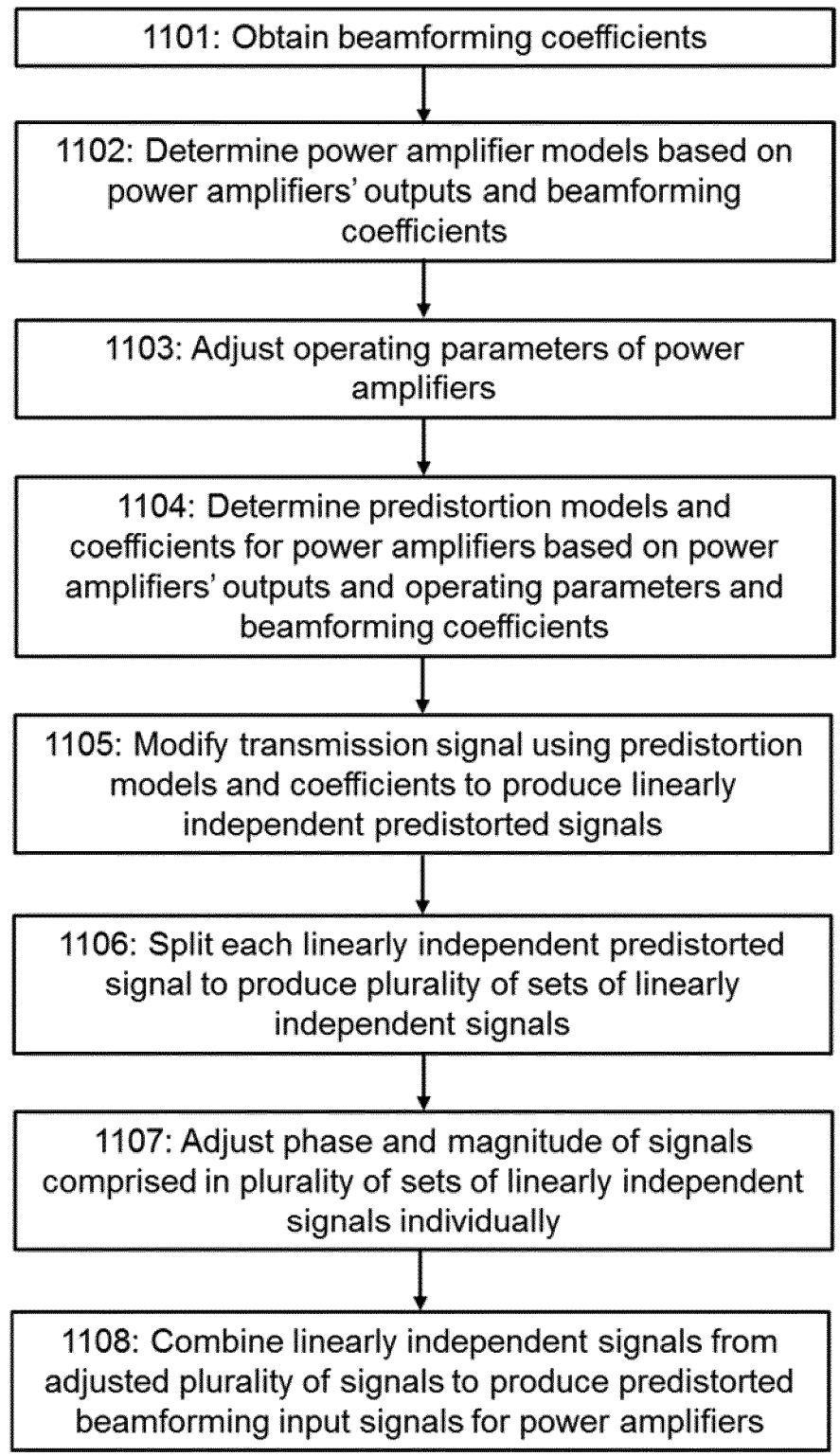
Figure 12:
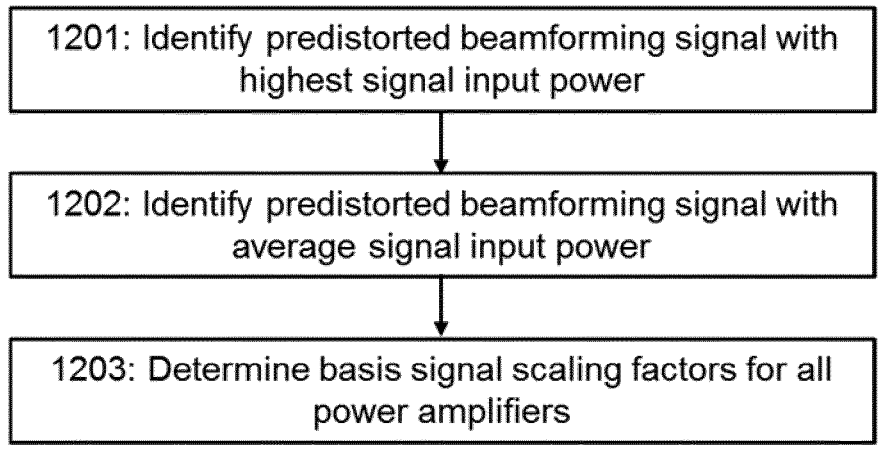
Figure 13:
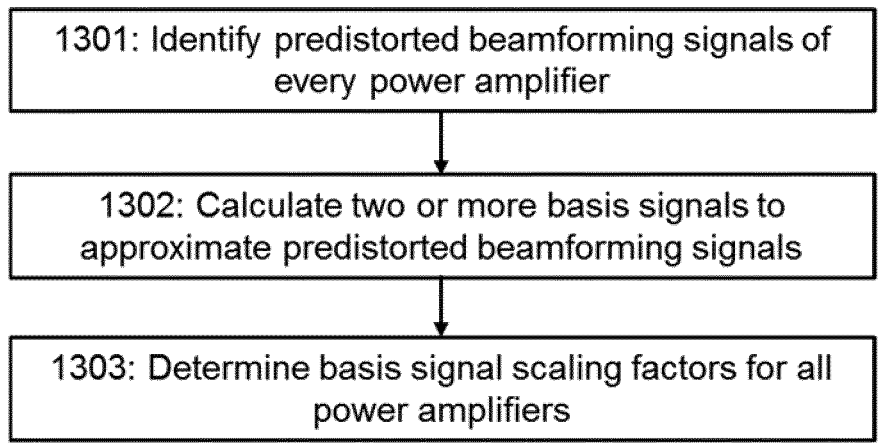

FIG. 8 a flow diagram illustrating a process according to an embodiment of the invention for optimizing filtering coefficients;

FIG. 9 illustrates an analogue/hybrid beamforming system with multiple predistorter output signals according to an embodiment of the invention;

FIG. 10 illustrates an analogue/hybrid beamforming system according to an embodiment of the invention with multiple predistorter output signals and a common receiver/feedback receiver;

FIG. 11 is a flow diagram illustrating a process according to an embodiment of the invention for predistorting beamforming signals;

FIG. 12 is a flow diagram illustrating a process according to an embodiment of the invention for choosing basis signals for predistortion; and FIG. 13 is a flow diagram illustrating a process according to an embodiment of the invention for choosing basis signals for predistortion.

DESCRIPTION OF EMBODIMENTS

Figure 1:
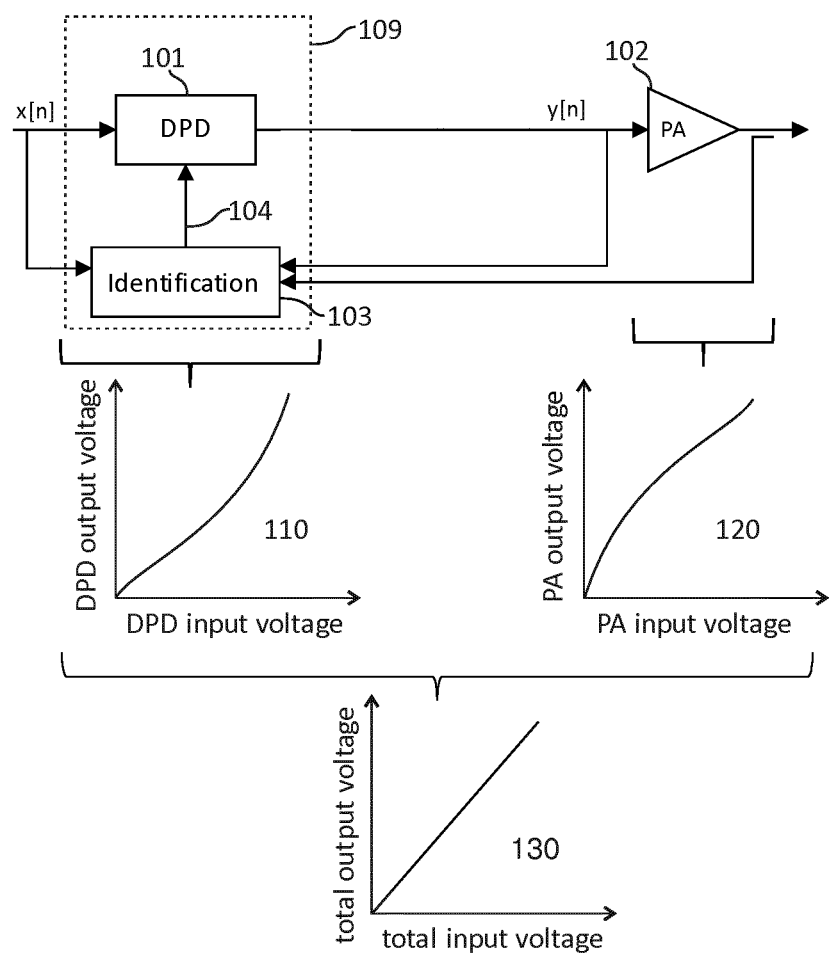

To provide background to the embodiments of the invention, FIG. 1 illustrates a simple cascade of elements illustrating the basic principle of digital predistortion using feedback (or "direct learning") on which the embodiments of the invention are based. The illustrated cascade of elements comprises a predistortion unit 109 and a radio frequency (RF) power amplifier 102. The predistortion unit 109 further comprises a digital predistorter (DPD) 101 and an identification unit 103 for the digital predistorter 101.

As described above, a power amplifier (or here in particular the power amplifier 102) may distort the amplitude and phase of the signal by compressing the signal or by causing nonlinearity between the input and output signal of the power amplifier. These effects typically increase as the input signal level increases or the signal bandwidth (that is, bandwidth required for the power amplifier 102) increases. The amplitude and phase distortion caused by the power amplifier 102 may be compensated for by predistorting the transmission signal x[n] using the predistorter 101 before feeding it to the power amplifier 102 so that the total response of the cascade is linear where n is an integer representing the nth sample of a digital signal. In other words, the input signal of the predistortion unit 109 x[n] and the output signal of the power amplifier 102 have the same shape in frequency domain but different amplitudes and phases, that is, there is no deformation despite of the nonlinearity of the power amplifier 102 as the predistorter inversely models the gain and phase characteristics of the power amplifier 102. This relationship is illustrated in insets 110, 120, 130 of FIG. 1 illustrating the nonlinear response of the predistorter 101 and the power amplifier 102 and the resulting linear response of the cascade formed by the predistorter 101 and the power amplifier 102. The predistorter 101 is typically a tunable element response of which is defined using a set of complex predistortion coefficients.

Obviously, compensation in the predistorter for the nonlinearity of the power amplifier 102 requires a very specific configuration for the predistorter 101 (or the predistortion coefficients) and one which should ideally change dynamically as the properties of the power amplifier 102 change (e.g., due to temperature drift or aging). A common approach to achieving this property (as illustrated in FIG. 1) relies on constantly monitoring the amplitude and phase distortion caused by the power amplifier 102 and feeding this feedback signal back to the predistorter 101 for determining the predistortion coefficients. Specifically, the output signal of the power amplifier 102 and at least one of the transmission signal x[n] and the predistorted transmission signal y[n] may be fed to the identification unit 103 of the predistorter 101 where they are compared. Based on the comparing, a set of complex coefficients for the predistorter 101 may be calculated by the identification unit 103 or drawn from a look-up-table in a memory of the identification unit 103 to compensate for the current power amplifier response.

Figure 2:
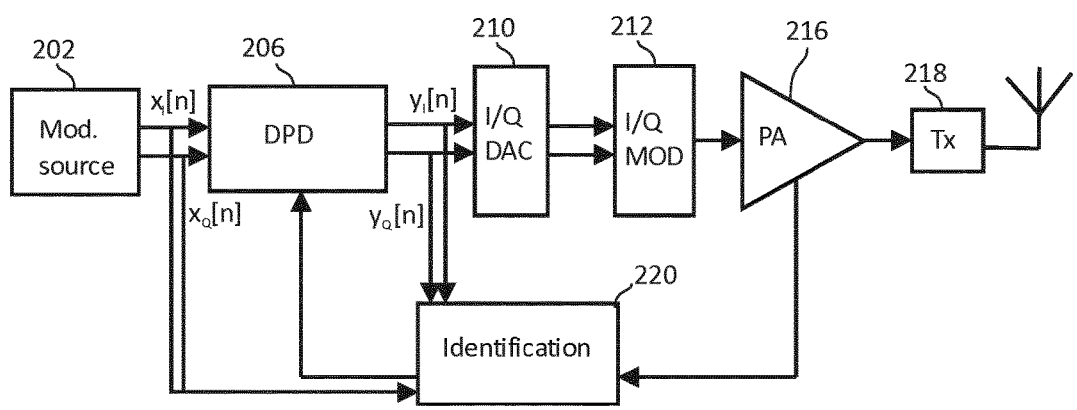
FIG. 2 illustrates a transmitter according to an embodiment of the invention.

FIG. 2 is a block diagram illustrating components of a radio transmitter according to an embodiment of the invention. The radio transmitter may be a mobile communication device, for example. The block diagram of FIG. 2 illustrates components related to predistortion and power amplification of a transmission signal. All of the components illustrated in FIG. 2 are obviously not necessary for carrying out the invention, and the radio transmitter may comprise additional components.

In FIG. 2, a modulation source 202 provides a transmission signal comprising information symbols to be transmitted from the radio transmitter to a radio receiver. The transmission signal may be in a digital form and divided into an in-phase (I) component and a quadrature (Q) component. The transmission signal is then fed to a predistortion unit 206. The predistortion unit 206 receives the I and Q components of the transmission signal output from modulation source 202. The predistortion unit 206 predistorts the transmission signal to compensate for the nonlinearity of the power amplifier based on the input from the identification unit 220 which may have knowledge on the amplitude and phase distortion properties of a power amplifier 216 similar to the cascade of FIG. 1. The predistortion unit 206 outputs the predistorted transmission signal into an I/Q D/A converter 210. The composition and detailed operation of the predistortion unit 206 as well as the identification unit 220 is discussed later in relation to detailed embodiments of the invention.

The I/Q D/A converter 210 converts the digital I and Q components into analog signals and feeds them to an I/Q modulator 212. The I/Q modulator 212 converts the baseband analog I and Q components of the transmission signal into a radio frequency (RF) transmission signal. In other words, the I/Q modulator 212 modulates a carrier signal according to the information contained in the I or Q component of the transmission signal. A separate carrier is modulated for each I and Q component and a phase shift between the two carriers is typically 90 degrees. The carriers are then summed together to provide the RF transmission signal.

The RF transmission signal is then fed to the power amplifier 216. The power amplifier 216 receives a power supply voltage from a power supply voltage generator (not shown), which may be a switched-mode power supply (SMPS), for example. The power amplifier 216 then amplifies the transmission signal according to the power supply voltage provided by the power supply voltage generator and applies the power-amplified transmission signal to radio frequency (RF) front-end components 218 for transmission through an antenna, for example.

Elements processing digital baseband signals according to FIG. 2 may be implemented in one or more processing units configured by suitable software, application-specific integrated circuits (ASICs), and/or as separate logic circuits, for example.

Figure 3:
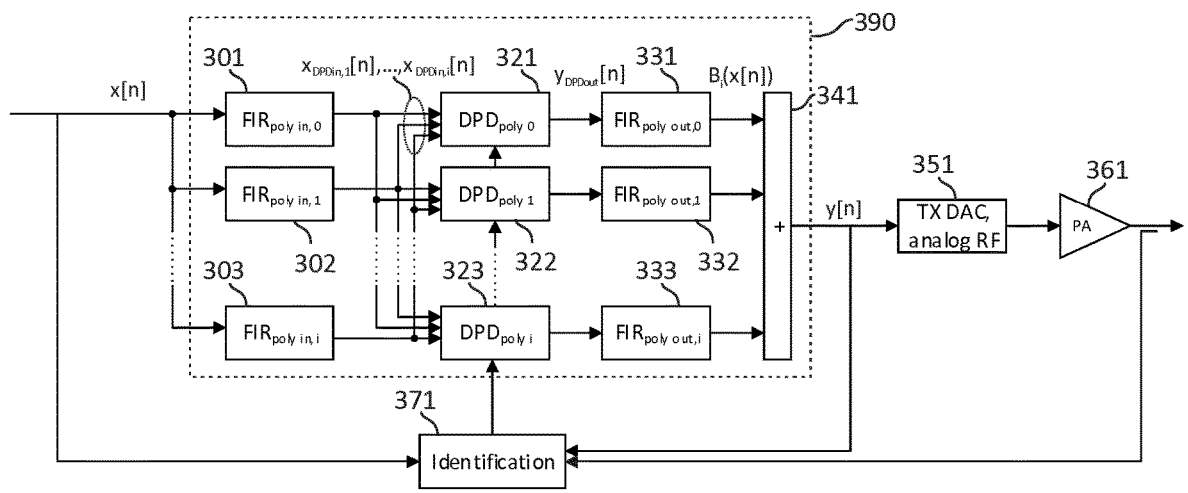
FIG. 3 illustrates a transmission signal predistortion unit according to an embodiment of the invention.

To achieve linearization results that fulfil standardization requirements of the latest 5G MIMO systems having limited bandwidth for TX-IQ interface, there is a need for increasing the processing sampling rate of the predistorter over that which may be achieved with the structures of FIG. 1 and FIG. 2. One common approach for improving the processing sampling rate involves using the cascade as illustrated in FIG. 1 or FIG. 2 but upsampling the input signal of the cascade to a higher clock frequency before feeding it to the predistorter and downsampling the resulting signal before the power amplifier. In such a case as well as in other cases where additional elements are introduced to the cascade of FIG. 1, the input signal of the DAC may also be fed to the identification unit to provide additional information about the response of the predistorter. A solution for performing predistortion with improved processing sampling rate according to an embodiment of the invention is illustrated in FIG. 3. Here and in the following, the separation of the signal to I and Q components is not explicitly denoted though it should be appreciated that the embodiments of the invention may be applied to I/Q signals and an I/Q demodulator may be connected between the digital-to-analog converter 351 and the power amplifier 361 similar to FIG. 2. It should also be appreciated that FIG. 3 shows a simple version of one embodiment of the invention. For example, some embodiments of the invention may comprise an analog-to-digital converter for the signal fed to the identification unit 371, additional amplifiers and/or additional filters. Any DC biasing lines or power sources needed for the power amplifier 361 and possibly for the predistortion unit 371 and/or identification unit 371 are also not shown for clarity. In an embodiment of the invention, the predistortion unit 206 of the transmitter of FIG. 2 may comprise elements 301 to 303, 321 to 323, 331 to 333, 341.

Similar to FIGS. 1 and 2, the system of FIG. 3 comprises a predistortion unit 390, an identification unit 371, a digital-to-analog converter 351 and a power amplifier 361. While the digital-to-analog converter 351 and the power amplifier 361 may operate as described in relation to FIGS. 1 and/or 2, the predistortion unit 390 has a specific composition and arrangement and due to which the identification unit 371 also operates in a unique manner compared to the previous examples.

Instead of predistorting the transmission signal x[n] directly with a single predistorter circuitry (that is, using a single predistortion model and with certain predistortion model coefficients), the transmission signal x[n] is divided into two or more polyphase components of the transmission signals before predistorting. The polyphase components are given by a polyphase decomposition of the transmission signal x[n]. The polyphase decomposition is defined according to one definition using the following two equations:

$$X(z) = \sum_{n=-\infty}^{\infty} x[n]z^{-n} = \sum_{k=0}^{M-1} X_k(z^M)z^{-k} \text{ and}$$

$$X_k(z) = \sum_{n=-\infty}^{\infty} x_k[n]z^{-n} = \sum_{n=-\infty}^{\infty} x[Mn+k]z^{-n}, 0 \leq k \leq M-1,$$

wherein the first equation shows how the z-transform of a sequence (i.e., here the transmission signal) X(z) may be rewritten as a sum of M z-transformed components $X_k(z)$ which are described using the second equation. The components $X_k(z)$ are called the polyphase components of X(z), subsequences $x_k[n]$ are called polyphase components of x[n] and M is the number of polyphase components in the decomposition. The polyphase components $x_k[n]$ of a polyphase decomposition effectively correspond to copies of the transmission signal x[n] downsampled by a factor of M with different time-shifts (i.e., x[Mn+k]) so that different sets of samples of the original sequence are used for forming the different polyphase components. Above definition of the polyphase decomposition corresponds to the so-called type-1 polyphase representation which is only one possible polyphase decomposition representation. It should be appreciated that the embodiments of the invention are not limited to this specific definition.

The division into polyphase components may be realized using a set of finite impulse response (FIR) filters 301, 302, 303, one for each polyphase component. The transmission signal is applied to each of the FIR filters 301, 302, 303. FIR filters are filters whose impulse response (or response to any finite length input) is of finite duration, settling to zero in finite time. FIR filters provide several advantageous properties compared to infinite impulse response (IIR) filters at the cost of requiring more computational power. Namely, FIR filters require no feedback, are inherently stable and may be easily configured to have linear phase response. For a causal discrete-time direct form FIR filter of order N, each value of the output sequence $y_{FIRout}[n]$ of the FIR filter is a weighted sum of the most recent input values $x_{FIR}$:

$$y_{FIRout}[n] = \sum_{i=0}^{N} b_i x_{FIRin}[n-i],$$

where $b_i$ are filtering coefficients and $x_{FIRin}[n-i]$ are commonly referred to as taps of the FIR filter. By comparing above equation to the equations for the polyphase decomposition, it is easy to see that the polyphase components $x_{FIRin}[Mn+k]$ of the transmission signal $x_{FIRin}[n]$ may be isolated from the transmission signal by applying the transmission signal to a FIR filter which is configured such that certain filtering coefficients are set to zero and optionally by downsampling the signal by a factor of M. The coefficient M may be defined by the processing sampling rate of the parallel predistorters 321, 322, 323 which may be tied to the clock frequency of the predistortion unit 390. The filtering coefficients $b_i$ (called here input filtering coefficients for FIR filters 301, 302, 303) which are non-zero may be optimized for best predistortion performance.

By performing a polyphase decomposition by feeding the transmission signal to a set of FIR filters 301, 302, 303 configured in different ways, a set of polyphase signals having a first sampling rate may be produced. As the different polyphase component signals have been sampled at different time instances, they provide different information about the transmission signal. By combining the information carried in the set of signals, the original transmission signal may be reproduced with a second sampling rate where the second sampling rate may be equal to or larger than the first sampling rate. The second sampling rate may also be called a virtual sampling rate as the corresponding sampling is achieved by simulating a signal with a high sampling rate with multiple signals with lower sampling rates. For example, if two polyphase components of the transmission signal are produced by two FIR filters, said two polyphase components may be combined to form a transmission signal with double the sampling rate compared to the sampling rate of the individual polyphase components by taking every other sample from the first polyphase component signal and every other from the second polyphase component signal. Therefore, by performing the polyphase division, the sample rate needed for a system may be reduced with little effect on the overall performance.

In some embodiments, the division into polyphase components may be realized using means other than FIR filters, for example, using autoregressive moving average model (AMA) models.

The splitter splitting the transmission signal and the FIR filters 301, 302, 303 (and/or any other means for performing polyphase division) may form a polyphase divider unit.

After two or more polyphase components of the transmission signal have been created, these polyphase component signals are fed to two or more parallel predistorters 321, 322, 323. Each polyphase component of the transmission signal may be fed to one or more parallel predistorters 321, 322, 323 of the two or more parallel predistorters 321, 322, 323 where they may be used to form a signal with an increased number of samples compared to the individual polyphase components. In other words, the input signals of each parallel predistorter 321, 322, 323 may comprise one or more polyphase components of the transmissions signal. In an embodiment, the input signals of each parallel predistorter 321, 322, 323 comprise all the polyphase components of the transmissions signal produced by the FIR filters 301, 302, 303. The parallel predistorters 321, 322, 323 perform nonlinear memory-based modelling on the polyphase component signals according to predistortion models with predistortion coefficients determined and communicated to the parallel predistorter 321, 322, 323 by the identification unit 371 to compensate for the nonlinearity of the power amplifier 361. The operation of the identification unit 371 is discussed in detail later. In some embodiments, the parallel predistorters 321, 322, 323 may form a single device or component, possibly also including the identification unit 371, operating at the same clock frequency. In some embodiments, two or more identification units may be used so that each parallel predistorter 312, 322, 323 has its own identification unit.

After the two or more polyphase components of the transmission signal have been predistorted by the two or more parallel predistorters 321, 322, 323, each of the output signals $y_{DPDout}[n]$ of the parallel predistorters 321, 322, 323 are fed to a FIR filter 331, 332, 333 and filtered again using different (output) filtering coefficients and/or orders. This second set of FIR filters 331, 332, 333 may act as recombination filters, performing filtering such that the resulting signals may be summed together by the summer 341. The bandwidth of the transmission signal may be increased due to the processing by the FIR filter 301, 302, 303 and the parallel predistorter 321, 322, 323, that is, the transmission signal may be widened in the frequency domain. This effect may be eliminated by the second set of FIR filters 331, 332, 333. The FIR filters 331, 332, 333 may also downsample the output signals $y_{DPDout}[n]$ of the parallel predistorters 321, 322, 323. The FIR filters 331, 332, 333 may be configured such that if the parallel predistorters 332, 322, 323 provide no predistortion for the polyphase components (i.e., only resampling the input signal and multiplying it by one), the summer 341 reproduces the original transmission signal x[n] or at least the shape of the original transmission signal x[n] (that is, the amplitude may be lowered but the shape is re-solved).

After the second set of FIR filters 331, 332, 333, the output signals $B_i[n]$, which may also be considered as the basis signals of the predistortion unit 390, may be combined by the summer 341 to form a predistorted transmission signal which may effectively have a higher sampling rate than what is allowed by the clock frequency of the predistortion unit 390. For example, as discussed above, if the transmission signal is divided into two polyphase components and predistorted as discussed above, the resulting predistorted transmission signal after the summing effectively corresponds to a predistorted transmission signal predistorted with a non-polyphase-based predistortion unit having double the physical clock frequency of the polyphase-based predistortion unit 390.

The FIR filters 331, 332, 333 and the summer 341 may form a polyphase combiner unit.

The identification unit 371 takes as its input the transmission signal x[n], the output signal of the predistortion unit 390 and the output signal of the power amplifier 361. In some embodiments, the identification unit may only take as its input the output signal of the power amplifier 361 and one of the transmission signal and the output signal of the predistortion unit 390. The identification may be configured to optimize the predistortion models and their coefficients based on the aforementioned input signals such that linear response is achieved for the total cascade formed by the predistortion unit 390, digital-to-analog converter 351 and the power amplifier 361. The identification unit 371 may, first, identify the response of the power amplifier 361 (that is, a power amplifier model and/or an inverse power amplifier model) and then evaluate what the optimal configuration of the parallel predistorters 321, 322, 323 would be to compensate for the nonlinearities of the power amplifier response. The determining the optimal configuration may comprise selecting a predistortion model and a set of predistortion parameter values for said model for each of the parallel predistorters 321, 322, 323. The predistortion models may be described using weighted polynomials, weighted Taylor series, weighted Volterra series, piecewise linear functions, splines, sum of time-shifted relations of an input variable with weights or any combination of the aforementioned types.

A memory unit (not shown in FIG. 3) may be comprised in or connected to the identification unit 371. The memory unit may maintain a plurality of lookup tables for different predistortion models having different complexities. Different predistortion models may correspond to different working conditions. The identification unit 371 may be configured to choose optimal predistortion models and optimal predistortion coefficients from these lookup tables based on its input signals (i.e., the predistorted transmission signal, the output of the power amplifier and/or the transmission signal before predistortion) using a search algorithm. The predistortion models and coefficients may be optimized, for example, in terms of one or more of the following factors: power, temperature, TDD (test-driven development) behavior of the transmission signal and drain voltage. The entries of the lookup tables, so-called bins, may be organized, e.g., by magnitude or power of one or more of the input signals of the identification unit 371. Furthermore, linear or higher order interpolation may be used by the search algorithm and another algorithm for calculating intermediate points between two bins. In an embodiment, the predistortion model and the predistortion coefficients for each of the two or more polyphase components of the transmission signal are selected as a result of minimizing of a difference between the transmission signal and the output signal of the power amplifier normalized to account for gain of the power amplifier 361. The gain of the power amplifier is to be understood here as the linear (non-frequency-dependent) gain of the power amplifier 361. As the predistortion coefficients and models for each parallel predistorter 321, 322, 323 have to be optimized by the identification unit 371, the identification unit 371 may comprise a polyphase structure similar to predistortion structure of the predistortion unit 390.

In an embodiment of the invention, the predistortion models selected by the identification unit 371 for the each of the parallel predistorters 321, 322, 323 are described by an equation:

$$y_{DPDout}[n] = \Sigma_{a,b,p} x_{DPDin}[n-m_a] T_p(|x_{DPDin}[n-k_b]|^2),$$

where $y_{DPD}[n]$ is a nonlinear memory-based polyphase component of the transmission signal (i.e., an output of a predistorter 321, 322, 323), $x_{DPDin}$ is formed by combining polyphase components of the transmission signal (i.e., inputs of predistorters 321, 322, 323), $T_p$ are predistortion basis functions of the predistortion model and $m_a$, $k_b$, a, b and p are predistortion model parameters. In general, the predistortion basis functions $T_p$ are nonlinear functions based on different states of the input signal providing memory effects. The predistortion basis functions $T_p$ may be simple linear functions, for example, $T_p(|x_{DPDin}(n-k_b)|^2) = a_p |x_{DPDin}[n-k_b]|^2$, where $a_p$ is a weighing factor to be optimized. The predistortion basis functions $T_p$ may also be nonlinear functions, sinusoidal functions, weighted polynomials, weighted Taylor series, weighted Volterra series, piecewise linear functions, splines, a sum of time-shifted relations of an input variable with weights, any other memory-based function or a combination (e.g., a sum) of any of the aforementioned functions. The predistortion basis functions $T_p$ may also be any filtered versions of any of the aforementioned functions.

The signal $x_{DPDin}$ may be defined, for example, using the following equation $$x_{DPDin}[n] = \sum_{m=0}^{M-1} (1 - |\text{sgn}(\text{mod}(n-m, M))|) x_{DPDin,m}\left[\frac{n-m}{M}\right],$$

where M is the number of the polyphase components which is equal to the number of the predistorters 321, 322, 323, $x_{DPDin,m}$ is the mth polyphase component of the transmission signal, m having values from 0 to M−1, and sgn is the signum function. The equation works so that every Mth sample of $x_{DPDin}[n]$ is taken from a particular polyphase component of the transmission signal. In other words, the first sample (n=0) is taken from the first polyphase component $x_{DPDin,0}[0]$, the second sample (n=1) is taken from the second polyphase component $x_{DPDin,1}[0]$, and so on until all the first samples of the polyphase components have been resampled after which the process repeats for the second samples ($x_{DPDin,0}[1]$, $x_{DPDin,1}[1]$, ..., $x_{DPDin,M-1}[1]$) of each polyphase component corresponding to values n=M, M+1 µM+2, ..., M+M−1. Thus, it is possible to construct a signal with a sampling rate (or a "virtual" sampling rate) M times the sampling rate of the polyphase components of the transmission signal.

To give a simple example of how the signal $x_{DPDin}$ may be constructed, the case where only two predistorters and polyphase components of the transmission signal exist is discussed here. In such a case, the general equation for $x_{DPDin}$ given above simplifies to $$x_{DPDin}[n] = (1 - |\text{sgn}(\text{mod}(n, 2))|)x_{DPDin,0}[n/2] + (1 - |\text{sgn}(\text{mod}(n-1, 2))|)x_{DPDin,1}[(n-1)/2].$$

Here, for every even sample ($n_{even}$=0, 2, 4, 6, ...) of $x_{DPDin}$, $(1-|\text{sgn}(\text{mod}(n_{even}-1,2))|)=0$ and $(1-|\text{sgn}(\text{mod}(n_{even},2))|)=1$ and thus $x_{DPDin}[n_{even}]=x_{DPDin,0}[n_{even}/2]$ is true. On the other hand, if n is an odd number ($n_{odd}$=1, 3, 5, 7, ...), $(1-|\text{sgn}(\text{mod}(n_{odd}-1,2))|)=1$ and $(1-|\text{sgn}(\text{mod}(n_{odd},2))|)=0$ and thus $x_{DPDin}[n_{odd}]=x_{DPDin,1}[(n_{odd}-1)/2]$ is true. In other words, every other sample of $x_{DPDin}$ is taken from the first polyphase component and every other from the second polyphase component.

While it was assumed in the last two equations that each predistorter 321, 322, 323 is provided with each polyphase component of the transmission signal, in some embodiments only some polyphase components may be fed to a particular predistorter 321, 322, 323. Obviously, in such a case the sampling rate may also be improved, but only in relation to the number of input polyphase signals of that predistorter.

Similar to the FIR filter, the terms corresponding to time-shifted copies of an input signal $x_{DPDin}$, that is, the polyphase components of the transmission signal $x_{DPDin}[n-m_a]$ and $x_{DPDin}[n-k_b]$ may be referred to as taps of the predistortion model. To be precise, different combinations of $m_a$ and $k_b$ define different taps of the predistortion model. For some of said combinations, the basis function $T_p$ may be defined to be an identically zero function. For example, only 3 taps may be chosen from a 3×3 array of possible taps. Each one of these combinations forms a predistortion component of the transmission signal all of which are summed to form an output signal of the predistorter 321, 322, 323. Different taps (that is, different combinations) may be defined for different predistorters 321, 322, 323. The number of taps needed for the optimal predistortion of a particular multi-phase component may also differ.

In some embodiments, same predistortion model may be defined to be used for all the predistorters 321, 322, 323. In such a case, predistortion coefficients corresponding only to a single predistortion model need to be optimized. In other embodiments, the complexity of the predistortion models may be set to be equal for all the predistorters 321, 322, 323. For example, the number of taps may be defined to have a certain value but the taps chosen for each predistorter 321, 322, 323 may differ. In other embodiments, a maximum limit for the model complexity (e.g., a maximum number of taps) may be defined.

The embodiments of the invention such as the one illustrated in FIG. 3 provide multiple advantages compared to the conventional non-polyphase-based predistortion solutions.

For example, the embodiments of the invention may provide reduced complexity, reduced power consumption and/or reduced required memory compared to conventional solutions and enable automatic balancing. Complexity may be reduced even up to 50% by the embodiments of the invention or conversely the size and power consumption may be reduced up to 50%.

Figure 4:
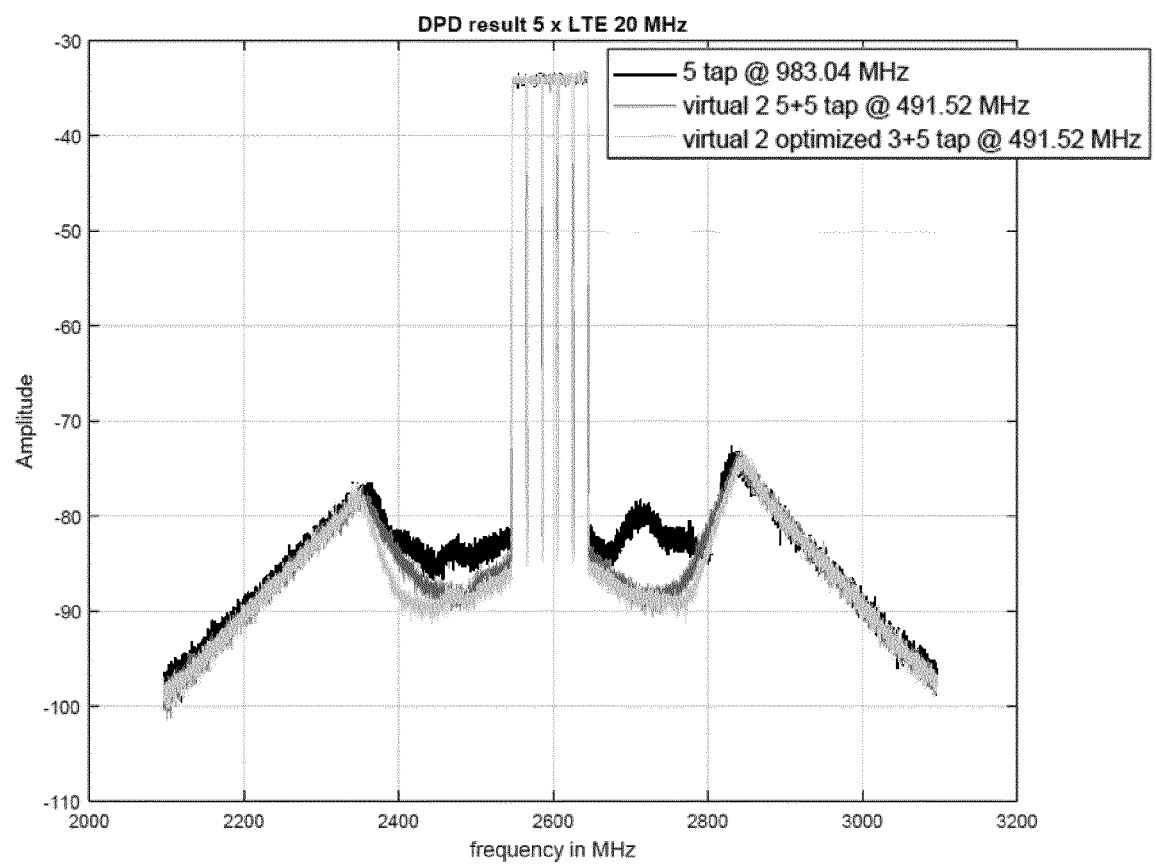
FIG. 4 illustrates an exemplary magnitude response of a transmission signal predistortion unit according to FIG. 3.

FIG. 4 illustrates linearization results (transmission signal amplitude after power-amplification as function of frequency) for an LTE signal with a center frequency of 2600 MHz and comprising five 20 MHz subbands using three different predistortion setups. In each case, the predistortion models used are defined using the equation $$y_{DPDout}[n] = \sum_{a,b,p} x_{DPDin}[n - m_a]T_p(|x_{DPDin}[n - k_b]|^2)$$

which was discussed previously in conjunction with FIG. 3 in detail. Apart from the operation of the predistortion unit (or specifically the parallel predistorters therein), the setup is the same in the three cases. The predistortion coefficients of the predistortion models used in the three cases are optimized for best predistortion performance (that is, for compensating the nonlinearity of the power amplifier as efficiently as possible). The first setup (black line) corresponds to a reference case where a simple predistortion setup similar to FIGS. 1 and 2 is used. In this case, the transmission signal is not divided into polyphase components and the clock frequency of the predistortion unit is 983.04 MHz. The second setup (dark gray line) corresponds to FIG. 3 where the transmission signal is divided into two polyphase components which are both fed to two parallel predistorters and the clock frequency of the predistortion unit is 491.52 MHz. Five taps are used in the predistortion models for both of the two polyphase components. Finally, the third setup (light gray line) is otherwise same as the second setup but the number of taps used in the two predistortion models for the two polyphase components are also optimized individually (in addition to the predistortion coefficients of the predistortion model). The number of taps are three and five for the first and second parallel predistorters, respectively.

The results of FIG. 4 indicate that even though the clock frequency of the predistortion unit is divided by two compared to the first setup, both polyphase-based solutions result in improved linearization. The improvement is most evident around 2500 MHz and 2700 MHz where the spurious signal level is clearly highest for the first setup. Moreover, by optimizing the complexity of each predistortion model separately, the results were further improved compared to the more complicated second setup as evidenced by the results of the second and third setups.

Figure 5:
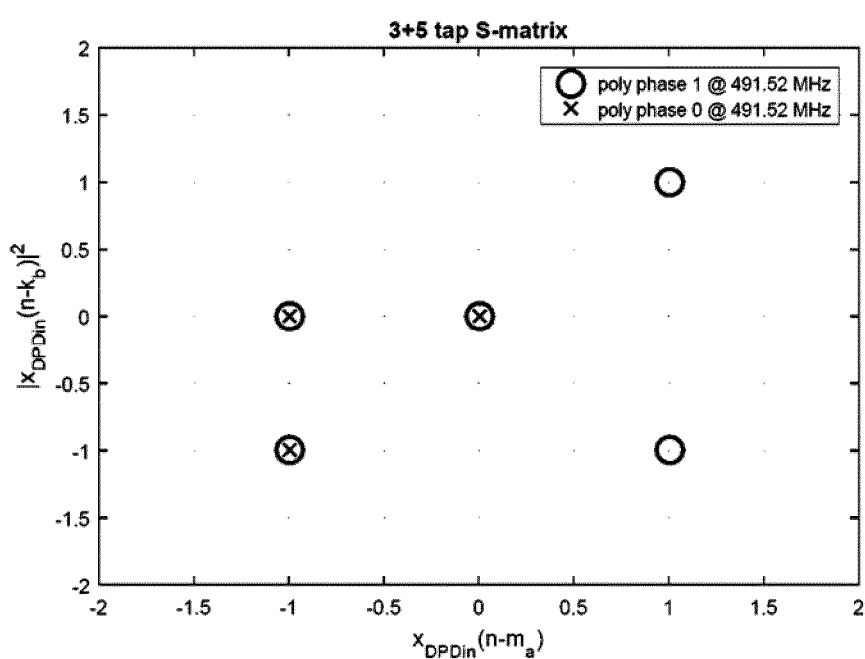
FIG. 5 illustrates exemplary model complexities for polyphase predistortion models used in a transmission signal predistortion unit according to FIG. 3.

FIG. 5 illustrates the predistortion model taps used in the third setup as discussed in relation to FIG. 4. By fully optimizing which taps to use with which predistorter, the number of taps may be reduced without compromising the performance (as shown in FIG. 4) which leads to reduction in the complexity of the required implementations. The taps were chosen in this example from a 3×3 tap matrix where each element represents a ($m_a$, $k_b$) pair. The $m_a$ and $k_b$ values ranged from −1 to 1 with unity spacing. In other embodiments of the invention, other numbers and/or ranges of values may be used. Each symbol in FIG. 5 denotes a single tap with the x-axis showing the corresponding $m_a$ value and the y-axis showing the corresponding $k_b$ value. The crosses denote the predistortion model used for the zeroth order predisorter having three taps which correspond to $(m_a, k_b)$ pairs (−1, −1), (−1, 0) and (0, 0). On the other hand, the circles denote the predistortion model for the first order predisorter having five taps which correspond to $(m_a, k_b)$ pairs (−1, −1), (−1, 0), (0, 0), (1, −1) and (1, 1).

Figure 6:
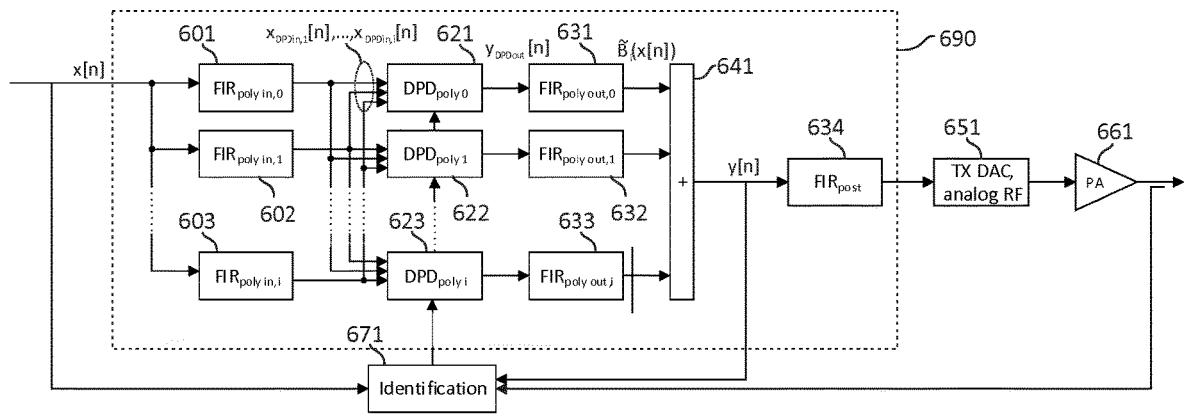
FIG. 6 illustrates a transmission signal predistortion unit according to an embodiment of the invention.

FIG. 6 illustrates an alternative embodiment of the invention. The illustrated alternative provides reduced complexity for the second set of the FIR filters 631, 632, 633. The common filter components of the FIR filters 331, 332, 333 in FIG. 3 may be implemented as a separate post FIR filter 634 for the predistorted transmission signal. Said post FIR filter 634 filters the predistorted transmission signal using post filtering coefficients and a post filtering order. The elements 601, 602, 603, 621, 622 623, 641, 651, 661 may operate as described in relation to FIG. 3 though aforementioned difference in the FIR filter setup compared to FIG. 3 should be taken into account in the configuration of the identification unit 671.

Figure 7:
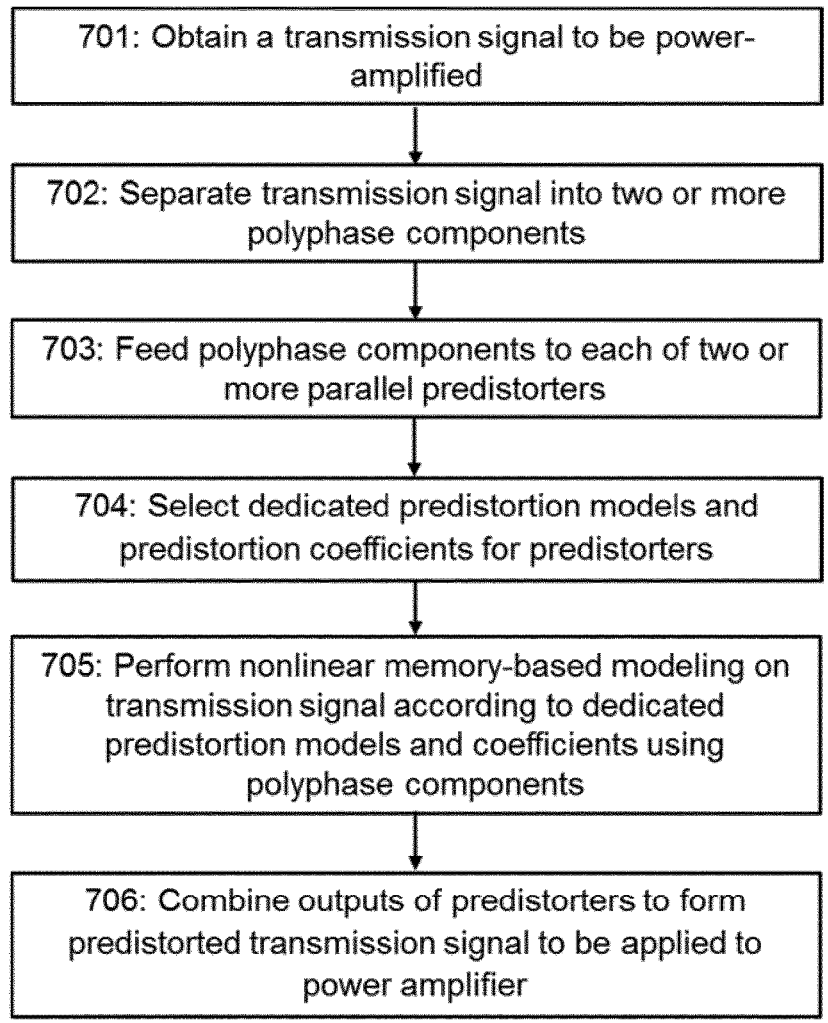
FIG. 7 is a flow diagram illustrating a process according to an embodiment of the invention for predistorting a transmission signal before power amplification.

In the following, a process for predistorting at least the transmission signal according to an embodiment of the invention will be described with reference to a flow diagram of FIG. 7. The process may be carried out in a radio transmitter according to an embodiment of the invention. The process may be carried out using the predistortion unit 390 and the identification unit 371 of FIG. 3 or the predistortion unit 690, the identification unit 671 and the post-predistortion FIR filter 634 of FIG. 6. In an embodiment of the invention, block 701 may be performed by obtaining means, block 702 may be performed by separating means, block 703 may be performed by feeding means, block 704 may be performed by selecting means, block 705 may be performed by two or more modelling means and block 706 may be performed by combining means. Each of the two or more modelling means may be equivalent to, may comprise or may be connected to one of the two or more parallel predistorters (predistortion circuits). First, a transmission signal, that is, the signal to be power amplified and transmitted, is obtained, in block 701. The transmission signal may be obtained from a modulation source outputting data symbols to be transmitted from the radio transmitter over an air interface to a radio receiver. The transmission signal may comprise in-phase and quadrature components. Then, the transmission signal is separated, in block 702, into two or more polyphase components. The separating may comprise splitting the transmission signal and finite impulse response filtering each resulting subsignal using different (input) filtering coefficients and/or orders. The subsignals before filtering may be identical to each other. The two or more polyphase components of the transmission signal are fed, in block 703, to two or more parallel predistortion circuits (parallel predistorters). Each parallel predistortion circuits may be provided with one or more polyphase components comprised in the two or more polyphase components of the transmission signal.

A predistortion model and predistortion coefficients of said model are selected, in block 704, for the two or more parallel predistortion circuits. The selection may be based on the transmission signal, a predistorted transmission signal and/or a power-amplified transmission signal. Before the selecting, the power amplifier model or inverse power amplifier for the power amplifier may be determined as an intermediary result and consequently used for the selecting. The predistortion coefficients may be acquired from one or more lookup tables. The predistortion model and the predistortion coefficients may be selected as a result of minimizing of a difference between the transmission signal and the output signal of the power amplifier normalized to account for gain of the power amplifier. Some or all of the selected predistortion models may have different complexities compared to each other. The predistortion models may be described using weighted polynomials, weighted Taylor series, weighted Volterra series, piecewise linear functions, splines, sums of time-shifted relations of an input variable with weights or any combination of the aforementioned types.

Each of the parallel predistortion circuits performs, in block 705, nonlinear memory-based modeling on the transmission signal according to the selected dedicated predistortion models and coefficients using the one or more polyphase components of the transmission signal. Finally, the output signal of the predistortion circuits are combined, in block 706, to form a predistorted transmission signal to be applied to the power amplifier. The combining may comprise finite impulse response filtering each output signal of the predistorters using different (output) filtering coefficients and/or orders and summing resulting signals.

In addition to finding the optimal predistortion models and coefficients for the parallel predistorters, the filtering coefficients of the pre-predistortion FIR filters and the post-predistortion FIR filters may be optimized for improved predistortion performance. The optimization may be based on identifying each cascade formed by a pre-predistortion FIR filter, a predisorter and a post-predistortion FIR filter as a new basis function $B_i$ of the predistortion approach. The predistorted transmission signal y[n] may be written for the embodiment of FIG. 3 as:

$$y[n] = \sum_{i=0}^{N} B_i(x[n])$$
$$= \sum_{i=0}^{N} FIR_{polyout,i}(DPD_{poly,i}(FIR_{polyin,0}(x[n]), \ldots, FIR_{polyin,N}(x[n])))$$

For the embodiment of FIG. 6, the corresponding equation reads $$y[n] = \sum_{i=0}^{N} \tilde{B}_i(x[n]) * FIR_{post},$$

where $\tilde{B}_i$ are the basis functions for the alternative predistortion approach which may be defined similar to B, above. The optimization may be conducted using the basis functions $B_i$ or $\tilde{B}_i$ not only for the predistortion models and coefficients but also for the filtering coefficients simultaneously. The optimization may be conducted before the deployment of the predistortion unit or during the operation of the predistortion unit. In some embodiments, the predistortion model, the predistortion coefficients and the filtering coefficients of a pre-predistortion FIR filter and/or a post-predistortion FIR filter may be chosen beforehand based on optimization so that no post-predistortion FIR filter and/or pre-predistortion FIR filter is required for a particular polyphase component and/or a particular output signal of the predisorter, reducing complexity of the solution.

FIG. 8 illustrates a process for optimizing the FIR filtering coefficients and the predistortion coefficients within the same process according to an embodiment of the invention. The illustrated process may be performed by the identification unit 371 of FIG. 3 or the identification unit 671 of FIG. 7. The filtering coefficients optimized with the illustrated process may comprise input and/or output filtering coefficients and/or, in the case of the embodiment illustrated in FIG. 7, post filtering coefficients. In some embodiments, filtering orders may also be optimized. In some embodiments, a separate unit may be arranged for the optimizing the FIR filtering coefficients. The illustrated process may be repeated periodically during the operation of the predistortion system and/or it may be performed during the deployment or initialization of the predistortion system.

Referring to FIG. 8, the identification unit, first, receives, in block 801, at least the transmission signal x[n] and/or the predistorted transmission signal y[n] and the output signal of the power amplifier. Based on the received signals, the identification unit calculates, in block 802, FIR filtering parameters for the first and second sets of FIR filters (positioned before and after predistorters) and possibly (if such a filter is included in the system) for the post FIR filter as shown in FIG. 7. The FIR filtering parameters may comprise, for example, insertion loss, range of the stopband/passband, bandwidth and cutoff frequencies. Based on the calculated FIR filtering parameters, the identification unit calculates, in block 803, new FIR filtering coefficients for each filter, that is, for filtering the split transmission signal and the output signals of the parallel predistorters and optionally the predistorted transmission signal. The identification unit selects, in block 804, new predistortion coefficients to be used by the parallel predistorters based on the received signals and the new filtering coefficients. In some embodiments, the identification unit may also select new predistortion models and/or new filtering orders. The identification unit evaluates, in block 805, the error in the predistortion (or an error metric describing the error) corresponding to the new predistortion coefficients and the new FIR filtering coefficients. The error metric may quantify the non-linearity caused by the combination of the predistortion unit and the power amplifier when the predistortion unit is operating with the selected new predistortion and FIR filtering coefficients. The error metric may be evaluated based on the selected new predistortion and FIR filtering coefficients, previous predistortion and FIR filtering coefficients and/or one or more of the following signals: the transmission signal, predistorted transmission signal and the output of the power amplifier. If the error metric is above a pre-defined threshold for said error metric in block 806, the identification unit recalculates, in block 807, the new FIR parameters based on the information provided by the error metric and possibly other information pertaining to the error evaluation. Thereafter, blocks 803 to 806 are repeated. Once the error metric is below the pre-defined threshold for said error metric in block 806, the identification unit updates, in block 808, the predistortion coefficients to match the new predistortion coefficients and the FIR filtering coefficients to match the new FIR filtering coefficients in hardware.

Beamforming is a signal processing technique used for achieving directional signal transmission or reception with a desired radiation pattern or beam(s). This is typically achieved by combining elements in an antenna array in such a way that signals at particular angles experience constructive interference while others experience destructive interference. Such interference behavior is achieved usually by varying the amplitudes and/or phases of the signals applied to the antenna elements of the antenna array in a particular way. The antenna elements are most often identical to each other though in some cases they may also have different geometries and/or dimensions. Beamforming can be used at both the transmitting and receiving ends in order to achieve spatial selectivity (that is, providing transmission/reception only to/from certain directions). The analogue/hybrid beamforming systems may serve for adapting transmission beams of antennas for radio transmissions in the multi-antenna system. Examples of transmissions in the multi-antenna system comprise Multiple Input Multiple Output (MIMO) and Multiple Input Single Output (MISO) transmissions.

FIG. 9 shows an example of analogue/hybrid beamforming system according to an embodiment of the invention. The system comprises a beamforming unit 901 connected to two digital signal processing units 902 to 904, 912 to 914 which are in turn connected to two analog signal processing units 906 to 910, 916 to 920, each of which is connected to an antenna array 911, 921. In other embodiments, the number of digital and analog signal processing units and antenna arrays 902 to 904, 912 to 914, 906 to 910, 916 to 920, 911, 921 may be different.

Similar to FIGS. 1 to 3 and 6, the analogue/hybrid beamforming system of FIG. 9 takes advantage of a feedback signal 930, 940 produced by a power amplifier (or in this case a plurality of power amplifiers 909, 919) for applying predistortion to a transmission signal using a predistortion unit 904, 914. In this case, each feedback signal 930, 940 may comprise a plurality of individual feedback signals of a power amplifier 909, 919 and/or a single feedback signal formed by summing said plurality of feedback signals The beamforming unit 901 may be configured to calculate beamforming coefficients for the antenna elements of the antenna arrays 911, 921. For example, the beamforming unit 901 may calculate weighing factors and phase shifts required for each of the antenna elements in the antenna arrays 911, 921 for achieving certain beam(s). Moreover, the beamforming unit 901 may be configured to provide the calculated beamforming coefficients to the predistortion units 904, 914 to be used for determining the predistortion model and coefficients. The beamforming unit 901 may also be configured to provide the beamforming coefficients to the phase and magnitude shifters 906, 907, 916, 917 and/or the predistortion units 904, 914 may provide the beamforming coefficients for the phase and magnitude shifters 906, 907, 916, 917.

The digital signal processing units 902 to 904, 912 to 914 may comprise an interpolation units 902, 912 and a power amplifier control unit 902, 912. The interpolation units 902, 912 may be configured to interpolate (upsample) the signal provided by the beamforming unit 901. The power amplifier control units 902, 912 may be configured to control the power of the interpolated signal according to the peak power capability of the power amplifiers 909, 919. To achieve this, the power amplifier control units 902, 912 may clip the interpolated signal. For assessing the need for said control, the feedback signal(s) 930, 940 may be fed to the corresponding power amplifier control unit 903, 913. The power amplifier control units 902, 912 may control the operating parameters of the power amplifiers such as supply voltage, supply current, bias voltage and/or bias current. This control may be achieved by feeding DC signals 950, 960 to the power amplifiers 909, 919. Said DC signals may also be fed to the corresponding predistorter 904, 914 for reference.

The predistorters 904, 914 may be realized using any existing or future predistortion circuit technology. In the exemplary illustration of FIG. 9, each predistortion unit 904, 914 outputs only two signals though in other embodiments more than two signal may be output by each predistortion unit 904, 914. Said two or more output signals may be linearly independent of each other. In some embodiments, the predistorters 904, 914 may be based on separating the signal to polyphase components. In such embodiments, the digital signal processing units 902 to 904, 912 to 914 may comprise some or all of the elements shown in FIG. 3 or FIG. 6.

The digital-to-analog converters 905, 915 may be similar as described in relation to the digital-to-analog-converter 351 of FIG. 3 or the digital-to-analog-converter 651 of FIG. 6. In some embodiments, output signal of the power amplifiers 909, 919 may be used by the digital-to-analog converters 905, 915 for correcting DC offset and/or IQ imbalance.

The analog signal processing units 906 to 910, 916 to 920 may comprise tunable phase and magnitude shifters 906, 907, 916, 917, a summer 908, 918 power amplifiers 909, 919 and TX filters 910, 920. After the digital-to-analog conversion by the digital-to-analog converters 905, 915, each of the produced analog signals (radio signals) may be split into a plurality of analog signals. The tunable phase and magnitude shifters 906, 907, 916, 917 may be arranged to adjust the phase and magnitude of said plurality of analog signals. Some or all the tunable phase and magnitude shifters 906, 907, 916, 917 may be configured to provide different phase and magnitude shifting. The tunable phase and magnitude shifters 906, 907, 916, 917 may be controlled by the predistorting units 904, 914. The adjusting of phase and gain may be based on the beamforming coefficients and/or the predistortion models and coefficients such that signals fed to the antenna elements of the antenna arrays 911, 921 have desired phases and magnitudes and that linear response is achieved. Each summer 908, 918 may be configured to sum the signals produced by the power amplifier 909, 919 in sets of two or more signals. Here, the number of said two or more signals may be equal to the number of output signals of the corresponding predistortion unit 904, 914. The power amplifiers 909, 919 may be similar to the power amplifier 361 of FIG. 3 or the power amplifier 661 of FIG. 6. Filters 910, 920 may be arranged at the output of the power amplifiers 909, 919 for filtering the signal output from the power amplifiers 909, 919.

Each antenna array 911, 921 comprises a plurality of antenna elements. Each antenna element may be fed with a different power-amplified and filtered signal. The antenna elements may be, for example, planar elements such as microstrip antennas or dipole antennas.

For an analogue or hybrid beamforming system, it is often beneficial if the system is capable of reciprocal operation. To this end, FIG. 10 illustrates a hybrid beamforming system according to an embodiment of the invention with multiple DPD output signals and a common RX/RBRX (receiver/feedback receiver) in order to assure reciprocal TX/RX behavior. The transmitter elements 1001 to 1010 may correspond to corresponding elements of FIG. 9. The illustrated system is based on the use of switches 1020, 1030, 1040. Specifically, the reciprocity is achieved as the same combiner structure is used for RX and FBRX and the predistortion units 1001, 1002, 1003 may be configured based on the FBRX signal. The illustrated concept may enable the calibration of the power amplifier.

FIG. 11 illustrates a process for predistorting beamforming signals for a plurality of antennas according to an embodiment of the invention. The illustrated process may be performed by a digital signal processing unit 902 to 904, 912 to 914 connected to an analog signal processing units 906 to 910, 916 to 920 in the analogue/hybrid beamforming system of FIG. 9.

First, the digital processing unit obtains, in block 1101, a set of beamforming coefficients from the beamforming unit. The beamforming coefficients along with output signals of the power amplifier are used by the digital signal processing unit for determining, in block 1102, power amplifier models for the power amplifiers. Based on the determining, the digital signal processing unit adjusts, in block 1103, the operating parameters of the power amplifiers. The operating parameters may comprise, for example, a supply voltage, a supply current, a bias voltage, or a bias current. The operating parameters may be adjusted towards the determined power amplifier model such that all the power amplifiers have substantially similar nonlinear dynamic behavior. The digital signal processing unit determines, in block 1104, the predistortion models and predistortion coefficients based on the output signals of the power amplifiers, the operating parameters and the beamforming coefficients such that error in the outputs of the power amplifiers is reduced. The digital signal processing unit modifies, in block 1105, the transmission signal according to the predistortion models and predistortion coefficients to produce two or more linearly independent signals. After the two or more linearly independent signals are produced, they may be converted from digital signals to analog signals as in the embodiment of FIG. 9. Then, the analog signal processing unit splits, in block 1106, each of the linearly independent signals two or more times to produce a plurality of sets of linearly independent signals. The phase and magnitudes of each of said signals in the plurality of sets are adjusted, in block 1107, by the analog signal processing unit individually (that is, with possibly different phase and magnitude shifts for all of said signals). Finally, the analog signal processing unit combines, in block 1108, sets of two or more adjusted linearly independent signals comprised in the plurality of sets of adjusted linearly independent signals to produce a plurality of predistorted beamforming signals to be fed to the power amplifiers.

After the identification of the characteristic of all power amplifiers, it is possible to compute a set of two or more basis signals which allow to generate individual predistortion signals for every power amplifier as a linear combination of the basis signals. Analogue gain and phase shifters may be used to realize this linear combination.

FIG. 12 illustrates an exemplary process for calculating two basis signals. The illustrated process may be performed by the digital signal processing unit 902 to 905 (for example, by the predistorter 904, 914). First, the digital signal processing unit identifies, in block 1201, a predistorted beamforming signal of a power amplifier which has the highest signal input power. Then, the digital signal processing unit identifies, in block 1202, a predistorted beamforming signal of a power amplifier which has signal input power closest to the average signal input power of all the predistorted beamforming signals. Finally, the digital signal processing unit calculates, in block 1203, the scaling factors for all the power amplifiers so that a linear combination of the basis functions gives the best predistortion result.

While only two basis signals are calculated in the process illustrated in FIG. 12, it should be appreciated that said process may be easily extended to more than two basis signals. FIG. 13 illustrates an alternative process for calculating two or more basis signals. The illustrated process may also be performed by the digital signal processing unit 902 to 905 (for example, by the predistorter 904, 914). First, the digital signal processing unit identifies, in block 1301, predistorted beamforming signals of all the power amplifiers. Then, the digital signal processing unit calculates, in block 1302, two or more basis signals which best approximate the set of predistorted beamforming signals. Finally, the digital signal processing unit calculates, in block 1303, the scaling factors for all the power amplifiers so that a linear combination of the two or more basis signals gives the best predistortion result.

The embodiments of the invention may be realized in a radio transmitter comprising a processing unit configured to carry out baseband signal processing operations on signals to be transmitted from the radio transmitter. The processing unit may be implemented by an application-specific integrated circuit (ASIC) or by a digital signal processor configured by suitable software. The processing unit may be configured to perform at least some of the steps shown in the flowchart of FIG. 7 and/or FIG. 8 and/or FIG. 11 and/or FIG. 12 and/or FIG. 13 or described in connection with FIGS. 1 to 6 and 9 to 10. Some or all of the steps shown in the flowchart of FIG. 7 and/or FIG. 8 and/or FIG. 11 and/or FIG. 12 and/or FIG. 13 or described in connection with FIGS. 1 to 6 and 9 to 10 may be performed by dedicated hardware components. The embodiments may be implemented as a computer program comprising instructions for executing a computer process for predistorting a transmission signal before power amplification.

The computer program may be stored on a computer program distribution medium readable by a computer or a processor. The computer program medium may be for example, but not limited to, an electric, magnetic, optical, infrared or semiconductor system, device or transmission medium. The computer program medium may include at least one of the following media: a computer readable medium, a program storage medium, a record medium, a computer readable memory, a random access memory, an erasable programmable read-only memory, a computer readable software distribution package, a computer readable signal, a computer readable telecommunications signal, computer readable printed matter, and a computer readable compressed software package.

Even though the invention has been described above with reference to an example according to the accompanying drawings, it is clear that the invention is not restricted thereto but it can be modified in several ways within the scope of the appended claims. Therefore, all words and expressions should be interpreted broadly and they are intended to illustrate, not to restrict, the embodiment. It will be obvious to a person skilled in the art that, as technology advances, the inventive concept can be implemented in various ways. Further, it is clear to a person skilled in the art that the described embodiments may, but are not required to, be combined with other embodiments in various ways.

The invention claimed is:

1. A method, comprising:
obtaining a transmission signal to be power-amplified in a power amplifier prior to transmission;
separating the transmission signal into two or more polyphase components of the transmission signal;
feeding one or more polyphase components of the transmission signal comprised in the two or more polyphase components of the transmission signal to each of two or more parallel predistortion circuits;
selecting a dedicated predistortion model and dedicated predistortion coefficients for each of the two or more parallel predistortion circuits separately, to compensate for nonlinearity of the power amplifier;
performing, by the two or more parallel predistortion circuits, nonlinear memory-based modeling on the transmission signal according to the selected dedicated predistortion models and coefficients using the one or more polyphase components of the transmission signal;
combining output signals of the two or more parallel predistortion circuits to form a predistorted transmission signal; and
applying the predistorted transmission signal to the power amplifier.

2. The method of claim 1, wherein a number of the one or more polyphase components of the transmission signal fed to each of the two or more parallel predistortion circuits is equal to a number of the two or more polyphase components of the transmission signal.

3. The method of claim 1, wherein the two or more polyphase components of the transmission signal correspond to a first sampling rate and the output signals of the parallel predistortion circuits correspond to a second sampling rate, the second sampling rate being larger than the first sampling rate.

4. The method of claim 1, wherein dedicated predistortion models selected for the two or more predistorting circuits comprise two or more different predistortion models having different complexities.

5. The method of claim 1, wherein the dedicated predistortion model and the dedicated predistortion coefficients are selected based on an output signal of the power amplifier and one or more of the transmission signal and the predistorted transmission signal.

6. The method of claim 1, wherein the dedicated predistortion model and the predistortion coefficients are selected as a result of minimizing of a difference between the transmission signal and the output signal of the power amplifier normalized to account for gain of the power amplifier.

7. The method of claim 1, further comprising
storing a plurality of signal predistortion lookup tables for predistortion coefficients corresponding to predistortion models of different complexities,
wherein the dedicated predistortion model and the dedicated predistortion coefficients are selected using a search algorithm from the plurality of signal predistortion lookup tables.

8. The method of claim 1, wherein the dedicated predistortion models are described by an equation:

$$y_{DPDout}[n]=\Sigma_{a,b,p} x_{DPDin}[n-m_a]T_p(|x_{DPDin}[n-k_b]|^2),$$

wherein $y_{DPDout}$ is a nonlinear memory-based signal based on the transmission signal, n is an integer representing the nth sample of a signal, $X_{DPDin}$ is a transmission signal formed by combining the polyphase components of the transmission signal to provide higher sampling rate than a sampling rate of the polyphase components of the transmission signal, $T_p$ are predistortion basis functions of the dedicated predistortion model and $m_a$, $k_b$, a, b and p are parameters of the dedicated predistortion model.

9. The method of claim 1, wherein the separating the transmission signal into the two or more polyphase components of the transmission signal comprises splitting the transmission signal into two or more subsignals and finite impulse response filtering each of the two or more subsignals using different input filtering coefficients and/or input filtering orders.

10. The method of claim 9, wherein the combining the output signals of the two or more parallel predistortion circuits comprises finite impulse response filtering the output signals of the parallel predistortion circuits using different output filtering coefficients or output filtering orders, and summing resulting filtered signals to form the predistorted transmission signal.

11. The method of claim 10, wherein filtering coefficients are optimized by performing the following steps:

a) receiving at least the transmission signal or the predistorted transmission signal and the output signal of the power amplifier;
b) calculating filtering parameters for finite impulse response filtering the subsignals and the output signals of the parallel predistortion circuits and optionally the predistorted transmission signal based on received signals, wherein the filtering parameters comprise parameters relating to one or more of the following: insertion loss, range of the stopband/passband, bandwidth and cutoff frequencies;
c) calculating new filtering coefficients for finite impulse response filtering the subsignals and the output signals of the two or more parallel predistortion circuits and optionally the predistorted transmission signal based on the filtering parameters;
d) selecting new predistortion coefficients to be used by the two or more parallel predistortion circuits based on the received signals and the new filtering coefficients;
e) evaluating an error metric relating to error in predistortion based on the new predistortion coefficients and the new filtering coefficients; and
f) if a value of the error metric is below a pre-defined threshold for the error metric, updating the predistortion coefficients to match the new predistortion coefficients and the filtering coefficients to match the new filtering coefficients, otherwise recalculating the filtering parameters based on the error metric and repeating steps c) to f).

12. The method of claim 1, wherein the predistorted transmission signal is a digital signal, the method further comprising:
before applying the predistorted transmission signal to the power amplifier, converting the predistorted transmission signal to an analog signal.

13. A computer program product embodied on a non-transitory computer-readable medium, comprising program instructions which, when loaded into an apparatus, execute the method according to claim 1.

14. An apparatus, comprising:
at least one processor; and
at least one memory including computer program code;
the at least one memory and the computer program code configured to, with the at least one processor, cause the apparatus at least to:
obtain a transmission signal to be power-amplified in a power amplifier prior to transmission;
separate the transmission signal into two or more polyphase components of the transmission signal;
select a dedicated predistortion model and dedicated predistortion coefficients for each of two or more parallel predistortion circuits separately to compensate for the nonlinearity of the power amplifier, wherein
the dedicated predistortion model and the predistortion coefficients are selected as a result of minimizing of a difference between the transmission signal and the output signal of the power amplifier normalized to account for gain of the power amplifier, and
the dedicated predistortion model is associated with at least one of weighted Taylor series, splines, or sums of time-shifted relations of an input variable with weights;
perform nonlinear memory-based modeling on the transmission signal according to the selected dedicated predistortion models and coefficients using one or more polyphase components of the transmission signal comprised in the two or more polyphase components of the transmission signal;
combine output signals of the two or more parallel predistortion circuits to form a predistorted transmission signal; and
apply the predistorted transmission signal to the power amplifier, wherein the at least one memory and computer program code are further configured to cause the apparatus at least to
store a plurality of signal predistortion lookup tables for predistortion coefficients corresponding to predistortion models of different complexities, wherein the dedicated predistortion model and the dedicated predistortion coefficients are selected for each of the two or more parallel predistortion circuits using a search algorithm from the plurality of signal predistortion lookup tables.

15. The apparatus of claim 14, wherein the at least one memory and computer program code are further configured to cause the apparatus at least to use the one or more polyphase components of the transmission signal having a first sampling rate in the nonlinear memory-based modeling such that the output signals of the two or more parallel predistortion circuits correspond to a second sampling rate, the second sampling rate being larger than the first sampling rate.

16. The apparatus according to claim 14, wherein the at least one memory and computer program code are further configured to cause the apparatus at least to split the transmission signal into two or more subsignals and further comprises two or more input finite impulse response filters configured to filter each of the two or more subsignals using different input filtering coefficients or input filtering orders.

17. The apparatus according to claim 14, wherein the at least one memory and computer program code are further configured to cause the apparatus at least to filter the output signals of the two or more parallel predistortion circuits using different output filtering coefficients and/or output filtering orders and a summer configured to sum resulting filtered signals to form the predistorted transmission signal.

18. The apparatus according to claim 14, wherein the at least one memory and computer program code are further configured to cause the apparatus at least to
filter the predistorted transmission signal using post filtering coefficients and a post filtering order.

19. An apparatus, comprising:
at least one processor; and
at least one memory including computer program code;
the at least one memory and the computer program code configured to, with the at least one processor, cause the apparatus at least to:
obtain a transmission signal to be power-amplified in a power amplifier prior to transmission;
separate the transmission signal into two or more polyphase components of the transmission signal;
select a dedicated predistortion model and dedicated predistortion coefficients for each of two or more parallel predistortion circuits separately to compensate for the nonlinearity of the power amplifier;
perform nonlinear memory-based modeling on the transmission signal according to the selected dedicated predistortion models and coefficients using one or more polyphase components of the transmission signal comprised in the two or more polyphase components of the transmission signal;
combine output signals of the two or more parallel predistortion circuits to form a predistorted transmission signal; and apply the predistorted transmission signal to the power amplifier, wherein the at least one memory and computer program code are further configured to cause the apparatus at least to store a plurality of signal predistortion lookup tables for predistortion coefficients corresponding to predistortion models of different complexities, wherein the dedicated predistortion model and the dedicated predistortion coefficients are selected for each of the two or more parallel predistortion circuits using a search algorithm from the plurality of signal predistortion lookup tables.

20. An apparatus, comprising:

at least one processor; and at least one memory including computer program code;

the at least one memory and the computer program code configured to, with the at least one processor, cause the apparatus at least to:

obtain a transmission signal to be power-amplified in a power amplifier prior to transmission;

separate the transmission signal into two or more polyphase components of the transmission signal;

feed one or more polyphase components of the transmission signal comprised in the two or more polyphase components of the transmission signal to each of two or more parallel predistortion circuits;

select a dedicated predistortion model and dedicated predistortion coefficients for each of the two or more parallel predistortion circuits separately, to compensate for nonlinearity of the power amplifier;

perform, by the two or more parallel predistortion circuits, nonlinear memory-based modeling on the transmission signal according to the selected dedicated predistortion models and coefficients using the one or more polyphase components of the transmission signal;

combine output signals of the two or more parallel predistortion circuits to form a predistorted transmission signal; and apply the predistorted transmission signal to the power amplifier.

* * * * *